United States Patent
Slater, Jr. et al.

(10) Patent No.: US 7,642,121 B2
(45) Date of Patent: Jan. 5, 2010

(54) LED BONDING STRUCTURES AND METHODS OF FABRICATING LED BONDING STRUCTURES

(75) Inventors: David Beardsley Slater, Jr., Durham, NC (US); John Adam Edmond, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/268,466

(22) Filed: Nov. 11, 2008

(65) Prior Publication Data

US 2009/0068774 A1  Mar. 12, 2009

Related U.S. Application Data

(62) Division of application No. 11/114,639, filed on Apr. 26, 2005, now Pat. No. 7,642,861.

(60) Provisional application No. 60/565,960, filed on Apr. 28, 2004.

(51) Int. Cl.
H01L 21/00 (2006.01)
H01L 21/28 (2006.01)

(52) U.S. Cl. .................. 438/85; 438/104; 438/575

(58) Field of Classification Search .............. 438/26, 438/28, 35, 108
See application file for complete search history.

(56) References Cited

U.S. PATENT DOCUMENTS

| | | |
|---|---|---|
| 6,169,294 B1 | 1/2001 | Biing-Jye et al. |
| 6,483,196 B1 | 11/2002 | Wojnarowski et al. |
| 6,486,499 B1 | 11/2002 | Krames et al. |
| 6,747,298 B2 | 6/2004 | Slater, Jr. et al. |
| 6,812,502 B1 | 11/2004 | Chien et al. |
| 6,861,677 B2 | 3/2005 | Chen |
| 6,897,489 B1 | 5/2005 | Peng et al. |
| 6,914,268 B2 | 7/2005 | Shei et al. |
| 6,927,425 B2 | 8/2005 | Harle et al. |
| 6,949,773 B2 | 9/2005 | Shin |
| 6,958,498 B2 | 10/2005 | Shelton et al. |
| 2002/0068373 A1 | 6/2002 | Lo et al. |
| 2002/0179914 A1 | 12/2002 | Sheu |
| 2003/0010975 A1 | 1/2003 | Gibb et al. |
| 2003/0042507 A1 | 3/2003 | Slater, Jr. et al. |
| 2003/0045015 A1 | 3/2003 | Slater, Jr. et al. |
| 2003/0057421 A1 | 3/2003 | Chen |
| 2004/0026708 A1 | 2/2004 | Chen |
| 2004/0173808 A1 | 9/2004 | Wu |

(Continued)

FOREIGN PATENT DOCUMENTS

JP   58 207 682   3/1984

(Continued)

*Primary Examiner*—Long Pham
*Assistant Examiner*—Steven H Rao
(74) *Attorney, Agent, or Firm*—Summa, Additon & Ashe, P.A.

(57) ABSTRACT

A method is disclosed for fabricating an LED The method includes providing an LED chip having an epitaxial region comprising at least a p-type layer and an n-type layer, an ohmic contact formed on at least one of the p-type layer or the n-type layer, and a bond pad formed on the ohmic contact. The bond pad has a total volume less than about $3 \times 10^{-5}$ mm$^3$. The LED chip is bonded to a submount via thermocompression or thermosonic bonding.

12 Claims, 4 Drawing Sheets

U.S. PATENT DOCUMENTS

| | | |
|---|---|---|
| 2004/0182914 A1 | 9/2004 | Venugopalan |
| 2004/0200882 A1 | 10/2004 | Slater, Jr. et al. |
| 2004/0201110 A1 | 10/2004 | Venugopalan et al. |
| 2004/0211972 A1 | 10/2004 | Du et al. |
| 2005/0023550 A1 | 2/2005 | Eliashevich et al. |
| 2005/0087884 A1 | 4/2005 | Stokes et al. |
| 2005/0133797 A1 | 6/2005 | Seong et al. |
| 2005/0194605 A1 | 9/2005 | Shelton et al. |
| 2005/0205887 A1 | 9/2005 | Shei et al. |

FOREIGN PATENT DOCUMENTS

| | | |
|---|---|---|
| JP | 2002 280415 | 9/2002 |
| WO | 02/05350 | 1/2002 | though the transparent substrate. Junction-down mounting may be an especially desirable technique for mounting SiC-based LEDs. Since SiC has a higher index of refraction than GaN, light generated in the active region does not internally reflect (i.e. reflect back into the GaN-based layers) at the GaN/SiC interface. Junction-down mounting of SiC-based LEDs may improve the effect of certain chip-shaping techniques known in the art. Junction-down packaging of SiC LEDs may have other benefits as well, such as improved heat dissipation, which may be desirable depending on the particular application for the chip.

LED BONDING STRUCTURES AND METHODS OF FABRICATING LED BONDING STRUCTURES

CROSS-REFERENCE TO RELATED APPLICATIONS

This is a divisional application of Ser. No. 11/114,639 filed Apr. 26, 2005. Ser. No. 11/114,639 claims the benefit of Provisional Application Ser. No. 60/565,960, filed Apr. 28, 2004 entitled "LED with Reduced Volume Bond Pad," the disclosures of both of these are hereby incorporated herein by reference in their entirety as if set forth fully herein.

BACKGROUND

The present invention relates to semiconductor devices, and more particularly to light emitting diodes mounted to a submount in a junction-down configuration.

GaN-based light emitting diodes (LEDs) typically comprise an insulating or semiconducting substrate such as SiC or sapphire on which a plurality of GaN-based epitaxial layers are deposited. The epitaxial layers comprise an active region having a p-n junction that emits light when energized. A typical LED is mounted substrate side down onto a submount, also called a package or lead frame (hereinafter referred to as a "submount"). FIG. 4 schematically illustrates a conventional LED having an n-type SiC substrate 10, an active region 12 comprising an n-GaN-based layer 14 and a p-GaN-based layer 16 grown on the substrate and patterned into a mesa. A metal p-electrode 18 is deposited on the p-GaN layer 16 and a wire bond connection 28 is made to a bond pad 20 on the p-electrode 18. An n-electrode 22 on the conductive substrate is attached to metallic submount 24 using a conductive epoxy 26. In the conventional process, the conductive epoxy 26 (usually silver epoxy) is deposited on the submount and the LED is pressed into the epoxy 26. The epoxy is then heat cured which causes it to harden, providing a stable and electrically conductive mount for the LED chip. A substantial amount of the light generated in the active region 12 may be transmitted into the substrate and absorbed by the epoxy 26.

Junction-down (or "flip-chip") mounting of LEDs involves mounting the LED onto the submount substrate side up. Light is then extracted and emitted through the transparent substrate. Junction-down mounting may be an especially desirable technique for mounting SiC-based LEDs. Since SiC has a higher index of refraction than GaN, light generated in the active region does not internally reflect (i.e. reflect back into the GaN-based layers) at the GaN/SiC interface. Junction-down mounting of SiC-based LEDs may improve the effect of certain chip-shaping techniques known in the art. Junction-down packaging of SiC LEDs may have other benefits as well, such as improved heat dissipation, which may be desirable depending on the particular application for the chip.

One problem with junction-down mounting is illustrated in FIG. 5. Namely, when a chip is mounted junction-down on a conductive submount or package using conventional techniques, a conductive die attach material 26 is deposited on the chip and/or on the submount 24, and the chip is pressed into the submount 24. Alternatively, the conductive die attach material 26 may comprise a solder such as Sn or Au/Sn in which case the chip is bonded to the submount 24 by thermocompression bonding.

Thermocompression bonding is a technique whereby a device is mounted to a substrate or submount using heat and pressure, thereby creating a conductive bond between the device and the submount. Typically, a vacuum collet is used to pick up the device and physically place it in contact with a submount that is formed of a material with which the solder used may form an alloy. Once the device is in contact with the submount, force is applied to the device through the collet. Through a combination of heat and pressure, the solder becomes alloyed with the submount and the device is welded in place. In order to form such a bond, the device must include a metal pad layer made of a metal such as Sn that will form an alloy bond with the submount when heat and pressure are applied. Other metals and alloys having a sufficiently low melting point are Au/Sn, Pb/Sn, and Ag/Sn may be used. Some suitable submount materials are silver and gold.

Typical thermocompression processes utilize a minimum force of about 30 to 50 g to cause the die to become bonded to the submount. However, this force may cause some of the molten bond metal to squeeze out and form a shunt circuit between the n-type substrate and the submount around the p-n junction, degrading the device operation.

Accordingly, as illustrated in FIG. 5, the conductive die attach material 26 can squeeze out and make contact with the n-type layers 14 and 10 in the device, thereby forming a Schottky diode connection that short-circuits the p-n junction in the active region with predictably undesirable results. Thus, improvements in the design of LEDs may be desirable for improved junction-down mounting.

SUMMARY

An LED chip includes a bond pad suitable for thermosonic or thermocompression bonding such as Sn, AuSn or other metals. The physical dimensions of the bond pad are selected to discourage or prevent solder squeeze-out during thermocompression or thermosonic bonding with or without flux. In some embodiments, an AuSn bond pad is designed to accept 30 g to 70 g of force or more without squeeze-out.

Particular embodiments of the invention provide an LED chip having a bond pad wherein the bond pad has a total volume less than about $3 \times 10^{-5}$ mm$^3$. Other embodiments of the invention provide an LED chip having a bond pad wherein the bond pad has a total volume less than about $2.5 \times 10^{-5}$ mm$^3$.

In particular embodiments of the invention, the bond pad may be formed in the shape of a parallelepiped having a generally square or rectangular periphery, a cylinder having a generally circular periphery, or a polyhedron having opposing parallel faces and a generally star-shaped periphery. Other peripheral shapes are also possible and may be desirable depending on the shape of the LED chip.

Method embodiments of the invention include the steps of fabricating an LED chip having a first surface, an epitaxial mesa region on the first surface and a metal ohmic contact on the epitaxial region; forming a bond pad on the metal ohmic contact, such that the bond pad has a total volume less than about $3 \times 10^{-5}$ mm$^3$; and bonding the LED chip to a metal submount using thermosonic or thermocompression bonding. Further method embodiments of the invention include the steps of fabricating an LED chip having a first surface, an epitaxial mesa region on the first surface and a metal ohmic contact on the epitaxial region; forming a bond pad on the metal ohmic contact, such that the bond pad has a total volume less than about $2.5 \times 10^{-5}$ mm$^3$; and bonding the LED chip to a metal submount using thermosonic or thermocompression bonding.

DETAILED DESCRIPTION

Figure 1:
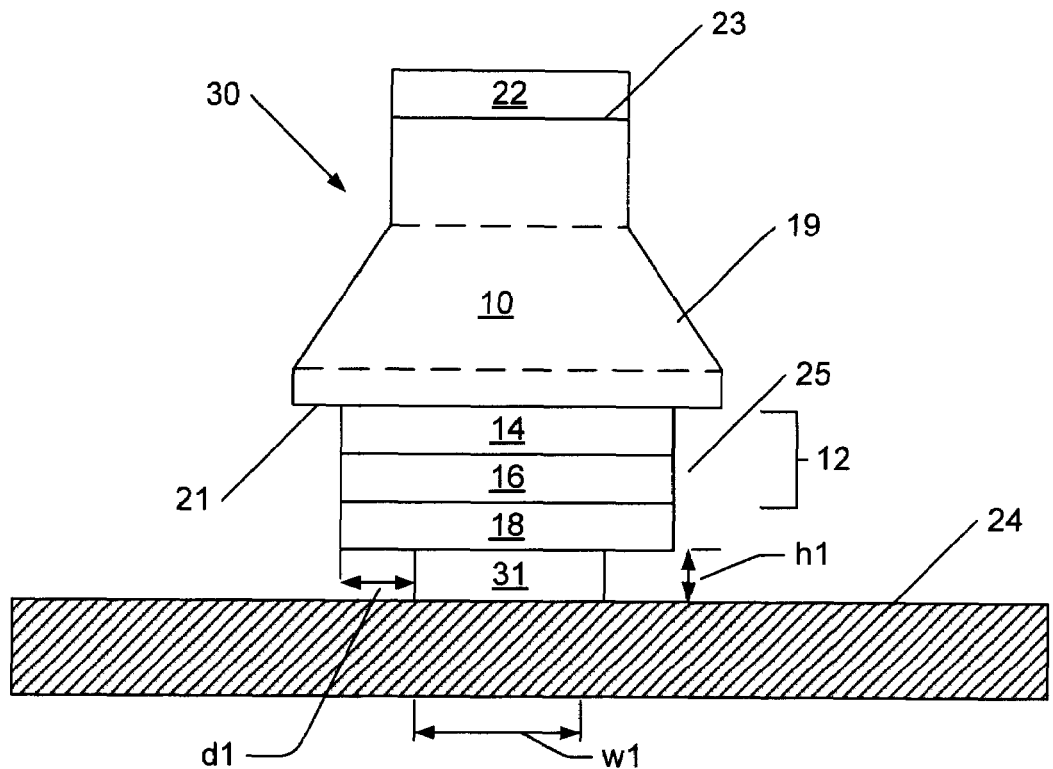
FIG. 1 is a side view of embodiments of the invention shown prior to bonding.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In particular, a metallic layer such as a bond pad may be described as being formed "on" an ohmic contact. It will be understood by those skilled in the art that intervening layers, such as for example barrier layers, adhesion layers and/or reflective layers, may be positioned between the bond pad and the ohmic contact.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the invention now will be described, generally with reference to gallium nitride-based light emitting diodes on silicon carbide-based substrates. However, it will be understood by those having skill in the art that many embodiments of the invention may be employed with many different combinations of substrate and epitaxial layers. For example, combinations can include AlGaInP diodes on GaP substrates; InGaAs diodes on GaAs substrates; AlGaAs diodes on GaAs substrates; SiC diode on SiC or sapphire ($Al_2O_3$) substrate; and/or a nitride-based diodes on gallium nitride, silicon carbide, aluminum nitride, sapphire, zinc oxide and/or other substrates.

FIG. 1 illustrates an LED chip having a shaped substrate. Specifically, the LED chip 30 shown in FIG. 1 has a substrate 10 having a first surface 21 and a second surface 23. The active region 12 is formed by epitaxial layers deposited on the first surface 21. An ohmic contact 18 is formed on p-type region 16. An n-type electrode 22 is formed on second surface 23 of the substrate 10. The epitaxial regions 14, 16 and the ohmic contact layer 18 are etched to form a mesa isolation structure 25. Ohmic contact layer 18 may comprise other metal layers such as barrier layers, adhesion layers and/or mirror layers.

In some embodiments, the width of first surface 21 of the LED chip may be approximately 300 μm or greater. In some embodiments, the width of the mesa structure 25 may be approximately 250 μm or greater.

LED chip 30 further includes a metal pad 31 through which chip 30 may be thermosonically or thermocompressively bonded to a submount 24. Pad 31 preferably comprises Au or a suitable metal alloy such as Au/Sn, Pb/Sn, Sn, Sn/Ag. Thermosonic bonding utilizes a combination of heat, pressure and ultrasonic vibration to bond the chip to the submount.

Figure 3A:
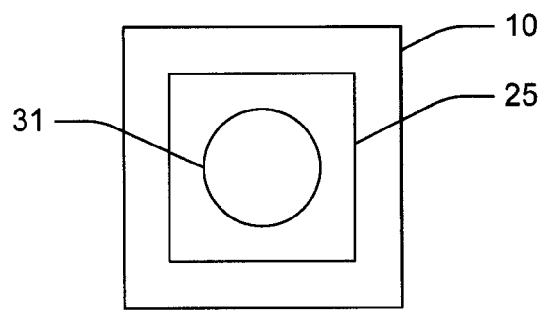
FIGS. 3A-3D are bottom views of embodiments of the invention.

In one embodiment illustrated in FIG. 3A, bond pad 31 comprises a generally cylindrical shape having a generally circular cross-section and having a height h1 of about 2 μm. The bond pad may have a diameter less than one half the width of mesa 25. In one embodiment, the circular bond pad has a diameter of 120 μm. In this embodiment, the volume of the bond pad may be less than about $2.3 \times 10^{-5}$ mm$^3$. In some embodiments, the volume of metal in the bond pad may be less than about $3 \times 10^{-5}$ mm$^3$. In other embodiments, the volume of metal in the bond pad may be less than about $2.5 \times 10^{-5}$ mm$^3$. Thus, the cylindrical bond pad illustrated in FIG. 3A may have a diameter of about 200 μm and a height of about 0.95 μm or less. In some embodiments, the cylindrical bond pad illustrated in FIG. 3A may have a diameter of about 200 μm and a height of about 0.8 μm or less.

Figure 3B:
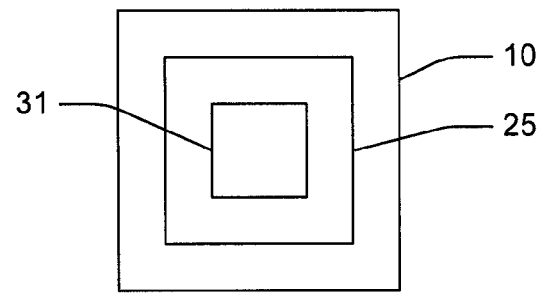

In other embodiments illustrated in FIG. 3B, bond pad 31 may comprise a parallelepiped having a height of about 1.2 μm and a generally square cross-section. A square bond pad may have a width of less than about ⅔ the width of mesa 25. In one embodiment, the square bond pad may have a width of about 150 μm, resulting in a volume of about $2.7 \times 10^{-5}$ mm$^3$. As with the embodiment illustrated in FIG. 3A, in some embodiments the volume of metal in the bond pad may be less than about $3 \times 10^{-5}$ mm$^3$, and in other embodiments, the volume of metal in the bond pad may be less than about $2.5 \times 10^{-5}$ mm$^3$.

Figure 3C:
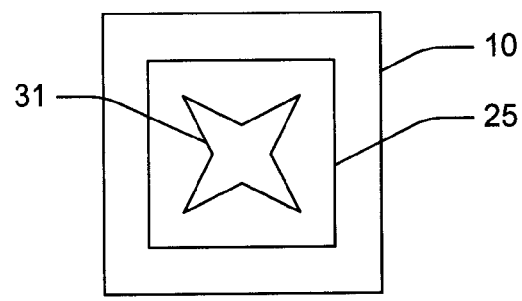

In other embodiments illustrated in FIG. 3C, the bond pad 31 comprises a polyhedron having opposing parallel faces and a periphery in the shape of a four-point star oriented such that the four points extend along the diagonals of the face of the chip. Other peripheral shapes are also possible and may be desirable depending on the shape of the LED chip. In this case, the distance from the edge of the bond pad to the edge of the mesa is preferably no less than about 50 μm. In some embodiments, the bond pad may be between 1.5 and 2.0 μm thick. As with the embodiments illustrated in FIGS. 3A and 3B, in some embodiments the volume of metal in the bond pad may be less than about $3 \times 10^{-5}$ mm$^3$, and in other embodiments, the volume of metal in the bond pad may be less than about $2.5 \times 10^{-5}$ mm$^3$.

Figure 3D:
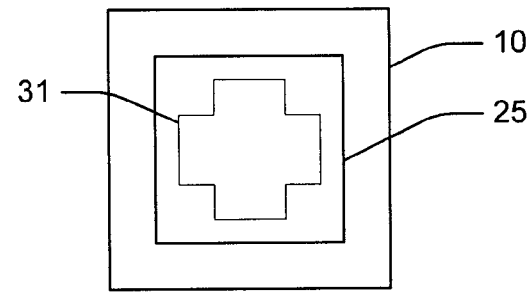
Figure 4:
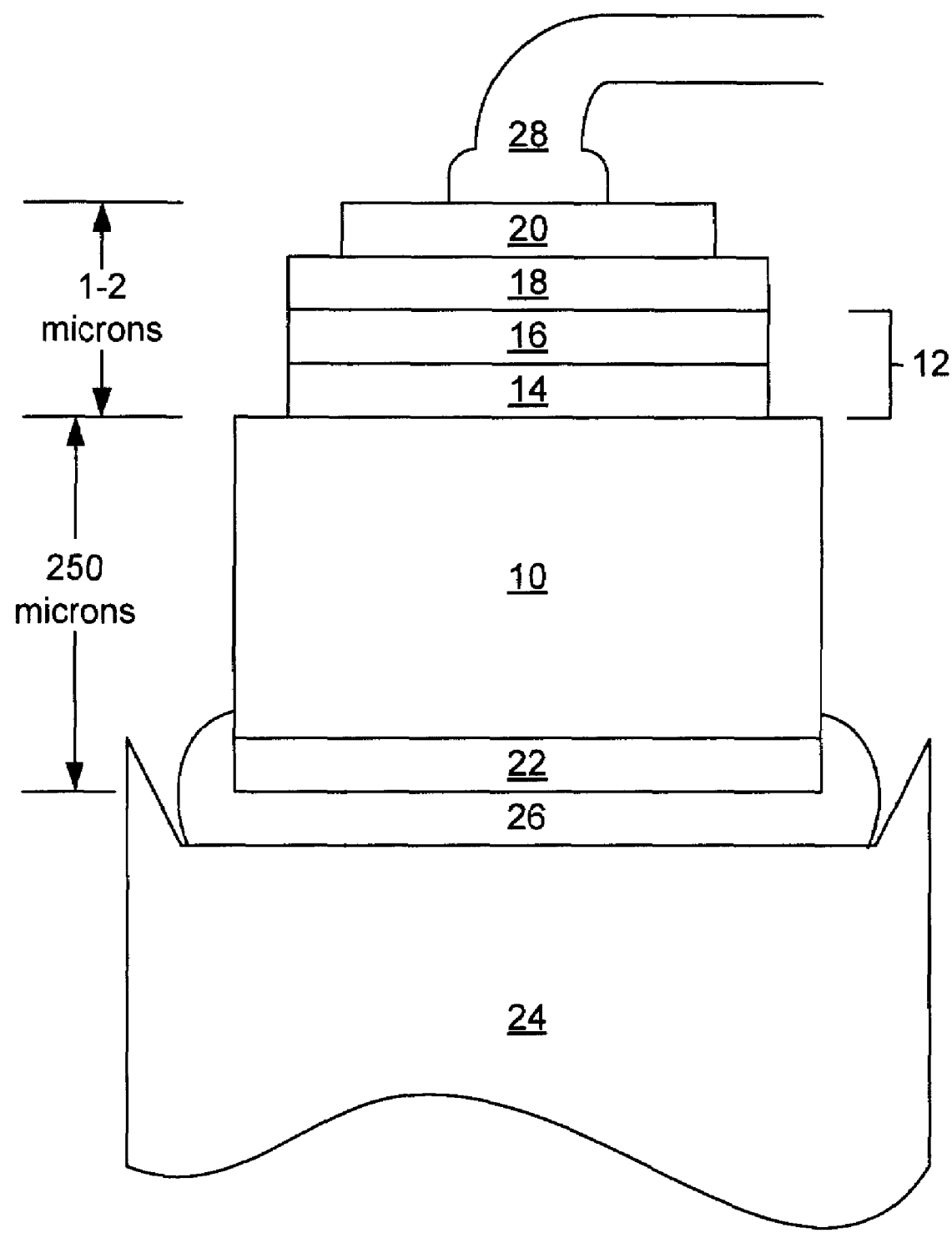
FIG. 4 is a side view of a conventional LED chip structure.
Figure 5:
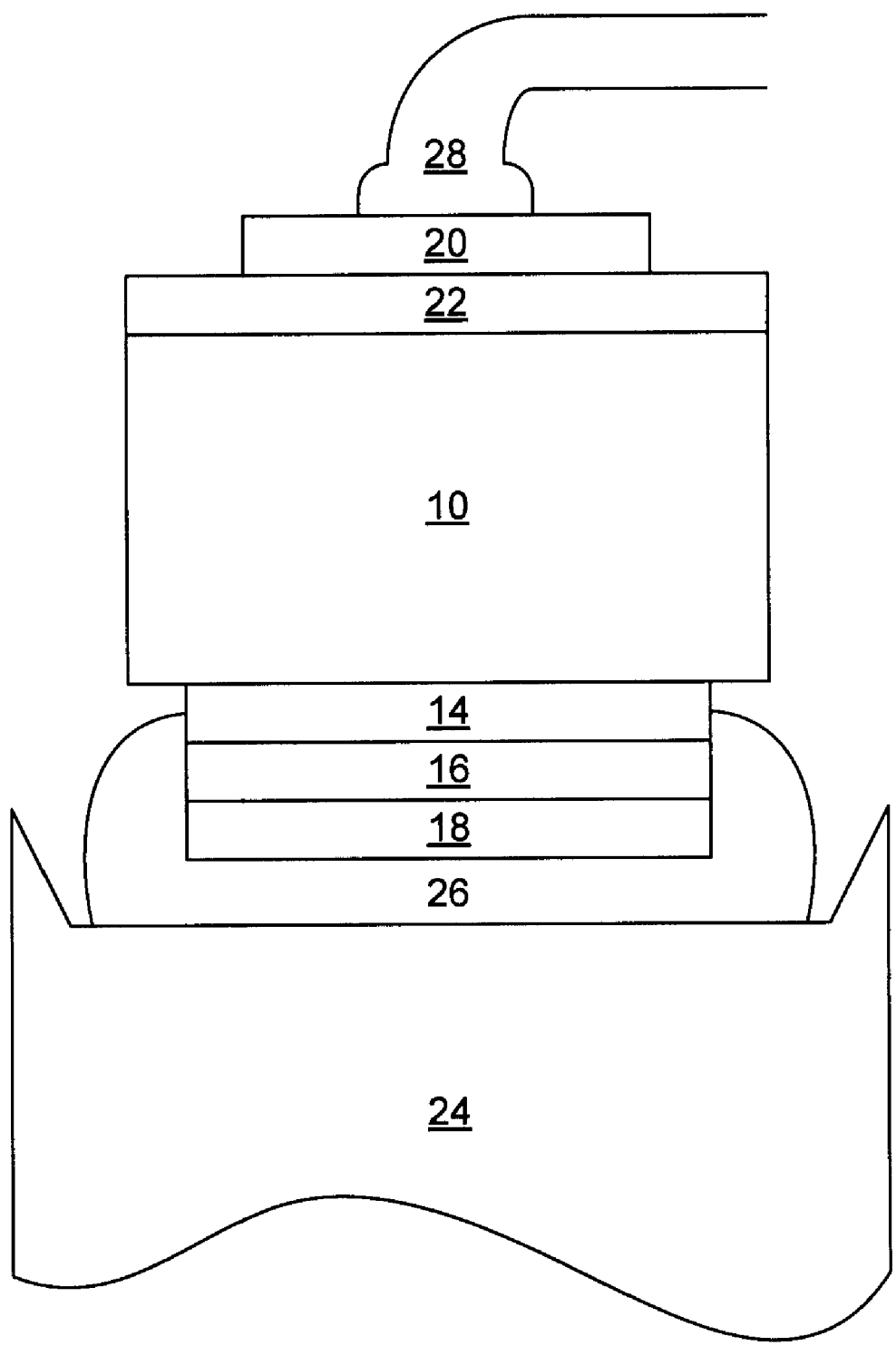
FIG. 5 is a side view of a conventional "flip chip" LED chip structure.

In yet other embodiments illustrated in FIG. 3D, the bond pad 31 comprises a polyhedron having opposing parallel faces and a periphery in the shape of a cross having generally rectangular regions extending towards the edges of the chip. In this case, the distance from the edge of the rectangular regions of the bond pad to the edge of the mesa is preferably about 20 μm. In some embodiments, the bond pad may be about 0.5 μm thick. In these embodiments, the volume of metal in the bond pad may be less than about $3 \times 10^{-5}$ mm$^3$, and in other embodiments, the volume of metal in the bond pad may be less than about $2.5 \times 10^{-5}$ mm$^3$.

Figure 2:
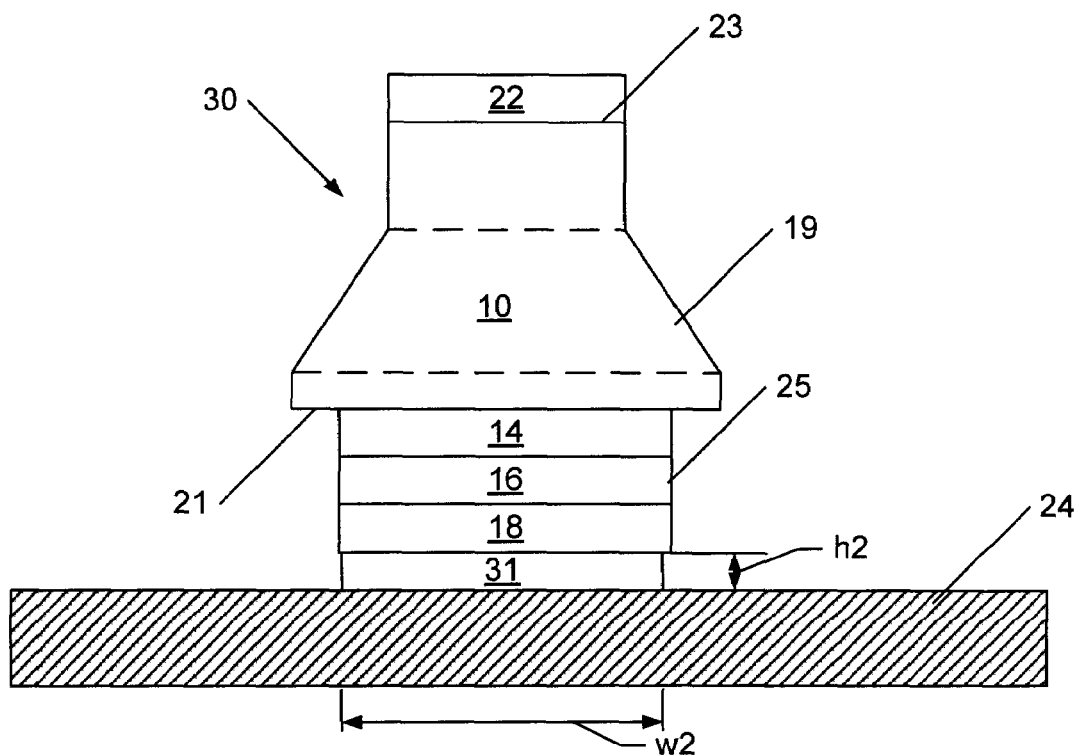
FIG. 2 is a side view of embodiments of the invention shown after bonding.

When the chip is welded to the substrate, the bond pad melts partially and deforms to a new size as illustrated in FIG. 2. In one embodiment, the height, width and shape of the bond pad 31 formed prior to mounting the chip are selected such that the total volume of material in the bond pad 31 is less than the resulting volume between the ohmic contact layer 18 and the submount 24 after thermosonic or thermocompression bonding using the application of 30-70 g of force. For example, in the embodiment illustrated in FIG. 2, the volume of material in the bond pad 31 is less than the height h2 multiplied by the area of the mesa 25 (equal to w2×w2).

In thermocompression or thermosonic bonding, the force applied to the chip affects the bond strength between the chip and the submount. While a lower applied force may result in less squeeze-out of solder, a lower force may also result in lower bond strength. Typically, bond strength is measured by the lateral shear strength of the bond between the chip and the submount. In some applications, a shear strength of 140 g may be acceptable. Greater shear strength may be desirable. For example, for mounting a chip having lateral dimensions on the order of 300 μm×300 μm, a shear strength of 300-600 g may be desired.

In the drawings and specification there have been disclosed embodiments of the invention, and, although specific terms have been employed, they have been used in a generic and descriptive sense only and not for purposes of limitation.

The invention claimed is:

1. A method of fabricating an LED comprising:
providing an LED chip having an epitaxial region comprising at least a p-type layer and an n-type layer, an ohmic contact formed on at least one of the p-type layer or the n-type layer, and a bond pad formed on the ohmic contact, the bond pad having a total volume less than about $3 \times 10^{-5}$ mm$^3$;
conductively joining the LED chip to a submount.

2. A method as recited in claim 1, wherein the step of bonding the LED chip to a submount comprises applying a force of about 30 to 70 g to the LED chip.

3. A method as recited in claim 2, wherein the applied force is about 50 g.

4. A method as recited in claim 1, wherein the LED chip includes a substrate, and the ohmic contact is formed on a surface of the epitaxial region opposite the substrate.

5. A method as recited in claim 1, wherein the bond pad has a total volume less than about $2.5 \times 10^{-5}$ mm$^3$.

6. A method as recited in claim 1, wherein the bond pad is formed in the shape of a parallelepiped having a generally square periphery.

7. A method as recited in claim 6, wherein the epitaxial region has a width of about 250 μm or more, and wherein the bond pad has a height of about 1.2 μm or less and a width of about 150 μm or less.

8. A method as recited in claim 1, wherein the bond pad is formed in the shape of a cylinder having a generally circular periphery.

9. A method as recited in claim 8, wherein the epitaxial region has a width of about 250 μm or more, and wherein the bond pad has a height of about 2 μm or less and a diameter less than one half the width of the epitaxial region.

10. A method as recited in claim 9, wherein the bond pad has a diameter of about 120 μm or less.

11. A method as recited in claim 1, wherein the bond pad is formed in the shape of a polyhedron having opposing parallel faces and a star-shaped or cross-shaped periphery.

12. A method as recited in claim 11, wherein the distance from an edge of the bond pad to an edge of the epitaxial region is at least about 20 μm.

* * * * *